(12) United States Patent
Sampath et al.

(10) Patent No.: US 12,439,664 B2
(45) Date of Patent: Oct. 7, 2025

(54) METHODS OF FORMING OHMIC CONTACTS ON SEMICONDUCTOR DEVICES WITH TRENCH/MESA STRUCTURES

(71) Applicant: Wolfspeed, Inc., Durham, NC (US)

(72) Inventors: Madankumar Sampath, Morrisville, NC (US); Sei-Hyung Ryu, Cary, NC (US); Rahul R. Potera, Apex, NC (US)

(73) Assignee: Wolfspeed, Inc., Durham, NC (US)

( * ) Notice: Subject to any disclaimer, the term of this patent is extended or adjusted under 35 U.S.C. 154(b) by 572 days.

(21) Appl. No.: 17/848,907

(22) Filed: Jun. 24, 2022

(65) Prior Publication Data

US 2023/0420536 A1 Dec. 28, 2023

(51) Int. Cl.
*H10D 62/832* (2025.01)
*H01L 21/285* (2006.01)
*H10D 62/85* (2025.01)
*H10D 64/62* (2025.01)

(52) U.S. Cl.
CPC ....... *H10D 62/85* (2025.01); *H01L 21/28575* (2013.01); *H10D 62/8325* (2025.01); *H10D 64/62* (2025.01)

(58) Field of Classification Search
CPC ....... H10D 64/01–037; H10D 64/0485; H10D 64/60–693; H10D 64/62; H10D 64/8325; H01L 21/0485
See application file for complete search history.

(56) References Cited

U.S. PATENT DOCUMENTS

| | | | |
|---|---|---|---|
| 7,875,545 B2 | 1/2011 | Ward, III et al. | |
| 2015/0037917 A1* | 2/2015 | Hori | H10D 64/62 438/29 |
| 2015/0048304 A1* | 2/2015 | Niwa | H10H 20/835 438/47 |
| 2015/0270354 A1* | 9/2015 | Shimizu | H01L 21/265 257/77 |
| 2017/0271157 A1* | 9/2017 | Utsumi | H10D 62/8325 |
| 2023/0124215 A1 | 4/2023 | Harrington, III et al. | |

* cited by examiner

*Primary Examiner* — Eric A. Ward
(74) *Attorney, Agent, or Firm* — Sage Patent Group

(57) ABSTRACT

A method of forming ohmic contacts on a semiconductor structure having a p-type region and an n-type region includes depositing a first metal on the n-type region, annealing the structure at a first contact anneal temperature to form a first ohmic contact on the n-type region, depositing a second metal on the first ohmic contact and on the p-type region, and annealing the structure at a second contact anneal temperature, less than the first contact anneal temperature, to form a second ohmic contact on the p-type region.

28 Claims, 15 Drawing Sheets

METHODS OF FORMING OHMIC CONTACTS ON SEMICONDUCTOR DEVICES WITH TRENCH/MESA STRUCTURES

FIELD

The present disclosure relates to semiconductor devices. In particular, the disclosure relates to silicon carbide semiconductor devices having trench/mesa structures with ohmic contacts thereon.

BACKGROUND

Power electronic devices manufactured using silicon carbide (SiC) are capable of high blocking voltages. For power devices having blocking voltages in the 600V-1000V range, SiC junction field effect transistors (JFETs) have two to three times smaller chip area than SiC metal-oxide semiconductor field effect transistors (MOSFETs). SiC JFETs can also be manufactured with a simpler manufacturing process than MOSFETs, which can lead to lower manufacturing costs. Moreover, SiC JFET devices have no $SiO_2$—SiC interface, which may increase device reliability, as oxide layers may break down under high voltage operation. JFET devices have the drawback of being normally-on devices. However, their advantages may outweigh their disadvantages in power applications, such as high reliability Si—SiC heterogeneously integrated circuits.

SUMMARY

A method of forming ohmic contacts on a semiconductor structure having a trench and a mesa adjacent the trench includes forming a dielectric layer in the trench, depositing a first metal on a top surface of the mesa, and removing the dielectric layer from the trench. After removing the dielectric layer from the trench, the structure is annealed at a first contact anneal temperature to form a first ohmic contact the top surface of the mesa. The method further includes depositing a second metal on a bottom surface of the trench, and annealing the structure at a second contact anneal temperature, less than the first contact anneal temperature to form a second ohmic contact to the bottom surface of the trench.

The semiconductor structure may have a first conductivity type at the top surface of the mesa and a second conductivity type at the bottom surface of the trench.

In some embodiments, the semiconductor structure includes silicon carbide, wherein the first conductivity type is n-type and the second conductivity type is p-type.

In some embodiments, the first metal and the second metal include a same metal, such as nickel.

In some embodiments, first metal and the second metal include different metals. For example, the first metal may include titanium and/or nickel, and the second metal may include aluminum and/or platinum.

The first contact anneal temperature may be greater than 750 C. In some embodiments, the first contact anneal temperature is between 800 C and 1200 C. The second contact anneal temperature may be between 650 C and 1000 C.

Annealing the structure to form the second ohmic contact may include annealing the structure at a sufficient temperature to form a metal silicide layer on the bottom surface of the trench.

The method may further include annealing the structure at a third contact anneal temperature that is lower than the first contact anneal temperature before removing the dielectric layer from the trench. The third contact anneal temperature may be sufficient to form a metal silicide layer at the top surface of the mesa. The third contact anneal temperature may be between 500 C and 800 C. In some embodiments, the third contact anneal temperature is greater than 700 C.

Annealing the structure to form the first ohmic contact may include annealing the structure in a furnace, and annealing the structure to form the second ohmic contact may include performing a rapid thermal anneal of the structure.

The structure may be a junction field effect transistor or an insulated gate bipolar transistor structure.

In some embodiments, forming the dielectric layer in the trench includes forming the dielectric layer on the semiconductor structure, wherein the dielectric layer covers the mesa and fills the trench, and selectively removing a portion of the dielectric layer above the mesa to expose a top surface of the mesa. Selectively removing the portion of the dielectric layer may be performed by planarizing the structure.

The first ohmic contact and the second ohmic contact may each have a contact resistance less than 1E-3 $\Omega$-cm$^2$. In some embodiments, the first ohmic contact and the second ohmic contact each have a contact resistance less than 1E-4 $\Omega$-cm$^2$.

The first ohmic contact and the second ohmic contact may be separated from one another.

A method of forming ohmic contacts on a semiconductor structure having a trench and a mesa according to some embodiments includes forming a mask on the top surface of the mesa, depositing a first metal on the bottom surface of the trench, removing the mask from the mesa, annealing the structure at a first contact anneal temperature to form an ohmic contact on the bottom surface of the trench, depositing a second metal on the top surface of the mesa, and annealing the structure at a second contact anneal temperature that is less than the first contact anneal temperature to form a second ohmic contact to the top surface of the mesa.

Some embodiments provide a semiconductor device including a first silicon carbide region having a first conductivity type, a second silicon carbide region having a second conductivity type, a first ohmic contact to the first silicon carbide region, wherein the first ohmic contact includes a first metal layer directly on the first silicon carbide region and a second metal layer on the first metal layer, and a second ohmic contact to the second silicon carbide region, wherein the second ohmic contact includes the second metal layer directly on the second silicon carbide region.

The first ohmic contact and the second ohmic contact may each have a contact resistance of less than about 1E-3 $\Omega$-cm$^2$.

The first silicon carbide region may be an n-type silicon carbide region, and the first ohmic contact may have has a contact resistance of less than about 1E-4 $\Omega$-cm2.

The second silicon carbide region may be a p-type silicon carbide region, and the second ohmic contact may have a contact resistance of less than about 5E-5 $\Omega$-cm2.

The first silicon ohmic contact may be formed on an upper surface of a mesa, and the second ohmic contact may be formed on a bottom surface of a trench adjacent to the mesa.

A method of forming ohmic contacts on a semiconductor structure having a p-type region and an n-type region according to some embodiments includes depositing a first metal on the n-type region, annealing the structure at a first contact anneal temperature to form a first ohmic contact on the n-type region, depositing a second metal on the first ohmic contact and on the p-type region, and annealing the structure at a second contact anneal temperature, less than the first contact anneal temperature to form a second ohmic contact on the p-type region.

The method may further include forming a mask on the p-type region prior to depositing the first metal, wherein the first metal is deposited onto the mask, annealing the structure at a third anneal temperature that is less than the first contact anneal temperature, and removing the mask after annealing the structure at the third anneal temperature.

BRIEF DESCRIPTION OF THE DRAWINGS

The accompanying drawings, which are included to provide a further understanding of the disclosure, are incorporated in and constitute a part of this specification, illustrate aspects of the disclosure and together with the detailed description serve to explain the principles of the disclosure. No attempt is made to show structural details of the disclosure in more detail than may be necessary for a fundamental understanding of the disclosure and the various ways in which it may be practiced. In the drawings.

DETAILED DESCRIPTION OF THE DISCLOSURE

Figure 1:
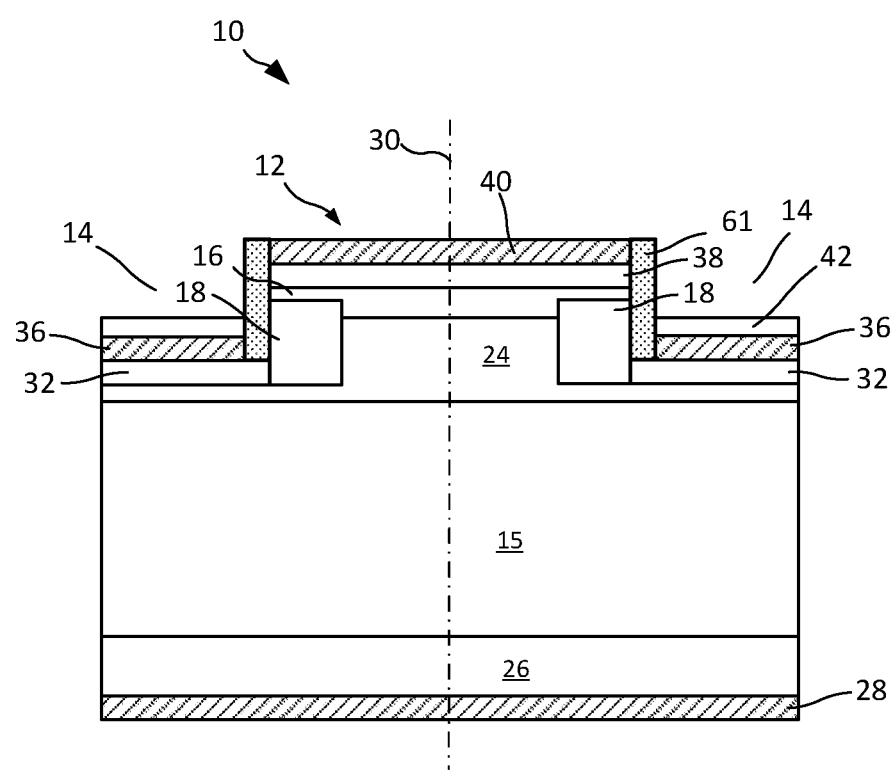
FIG. 1 illustrates a vertical JFET device structure.

Embodiments of the inventive concepts are explained more fully with reference to the non-limiting aspects and examples that are described and/or illustrated in the accompanying drawings and detailed in the following description. It should be noted that the features illustrated in the drawings are not necessarily drawn to scale, and features of some embodiments may be employed with other aspects as the skilled artisan would recognize, even if not explicitly stated herein. Descriptions of well-known components and processing techniques may be omitted so as to not unnecessarily obscure the aspects of the disclosure. The examples used herein are intended merely to facilitate an understanding of ways in which the disclosure may be practiced and to further enable those of skill in the art to practice the aspects of the disclosure. Accordingly, the examples and aspects herein should not be construed as limiting the scope of the disclosure, which is defined solely by the appended claims and applicable law. Moreover, it is noted that like reference numerals represent similar parts throughout the several views of the drawings.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the another element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the another element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular aspects only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art.

Although a JFET device is sometimes referred to as a static induction transistor, the term JFET will be used in the description below. However, it will be appreciated that embodiments described herein may be applied to any device that uses a depletion region to modulate the conductivity of a channel in a mesa.

Although some embodiments are described in the context of a silicon carbide JFET device, it will be appreciated that aspects of the inventive concepts may be applicable to other types of devices, such as MOSFETs, insulated gate bipolar transistors (IGBTs) and other types of devices.

An n-channel vertical JFET structure 10 is shown in FIG. 1. The vertical JFET structure 10 includes an n+ drain layer 26 on which an n– drift layer 15 is formed. An n-type channel region 24 is on the drift layer 15, and an n+ source layer 16 is on the channel region 24. An n++ source contact layer 38 is on the n+ source layer 16. A drain ohmic contact 28 is on the drain layer 26, and a source ohmic contact 40 is on the source contact layer 38. The channel region 24, source layer 16 and source contact layer 38 are provided as part of a mesa 12 above the drift layer 15. Trenches 14 are formed in the structure 10 adjacent the mesa 12.

A p+ gate region 18 is provided as part of the mesa 12 adjacent the channel region 24. A p++ gate contact region 32 is provided adjacent the gate region 18, and a gate ohmic contact 36 is formed on the gate contact region 32. A passivation layer 42 is on the gate ohmic contact 36 and the gate contact region 32. Silicon nitride spacer layers 61 are provided on sidewalls of the mesa 12.

The vertical JFET unit cell structure 10 is symmetrical about the axis 30 and includes two gate regions 18 as part of the mesa 12 on opposite sides of the channel region 24.

The channel of the vertical JFET structure 10 is formed within the mesa 12. The channel width is into the plane of FIG. 1, and the channel length is in the vertical direction. Such a vertical JFET structure with a short channel length may also be called a static-induction transistor (SIT). In a SIT, the channel length is chosen based on a trade-off between low on-resistance in the on-state (short channel) and resistance to drain-induced barrier lowering (DIBL) in the off-state. A p-channel JFET may have a similar structure, but the conductivity types are reversed from those shown in FIG. 1.

In operation, conductivity between the source layer 16 and the drain layer 26 is modulated by applying a reverse bias to the gate region 18 relative to the source layer 16. To switch off an n-channel device such as the JFET structure 10, a negative gate-to-source voltage, or simply gate voltage ($V_{GS}$) is applied to the gate region 18. When no voltage is applied to the gate region 18, charge carriers can flow freely from the source layer 16 through the channel region 24 and the drift layer 15 to the drain layer 26.

To form the gate ohmic contact 36 and the source ohmic contact 40, a layer of metal, such as nickel (Ni), is deposited on the upper surface of the source contact layer 38 and the upper surfaces of the gate contact regions 32 and patterned appropriately. The metal is then annealed (for example, by being subjected to high temperature for a period of time) to form metal silicide layers on the upper surface of the source contact layer 38 and the upper surfaces of the gate contact regions 32, which provide ohmic contacts to the underlying layers.

A problem arises, however, in that the source contact layer 38 and the gate contact regions 32 have opposite conductivity types. That is when the source contact layer 38 is n-type, the gate contact regions 32 are p-type, and vice-versa. Ohmic contacts formed on n-type silicon carbide exhibit lower resistance as the annealing temperature is increased. Conversely, ohmic contacts formed on p-type silicon carbide exhibit higher resistance as the annealing temperature is increased. Thus, the annealing temperature may be chosen as a temperature that achieves an acceptable conductivity for ohmic contacts to p-type silicon carbide and ohmic contacts to n-type silicon carbide, but that may not be optimal for either type of material.

Some embodiments provide methods of forming ohmic contacts to silicon carbide-based devices having a mesa/trench structure in which the ohmic contacts to n-type silicon carbide layers and ohmic contacts to p-type silicon carbide layers may be formed at different anneal temperatures, which may improve the conductivities of one or both types of contacts compared to conventional techniques.

Figure 2:
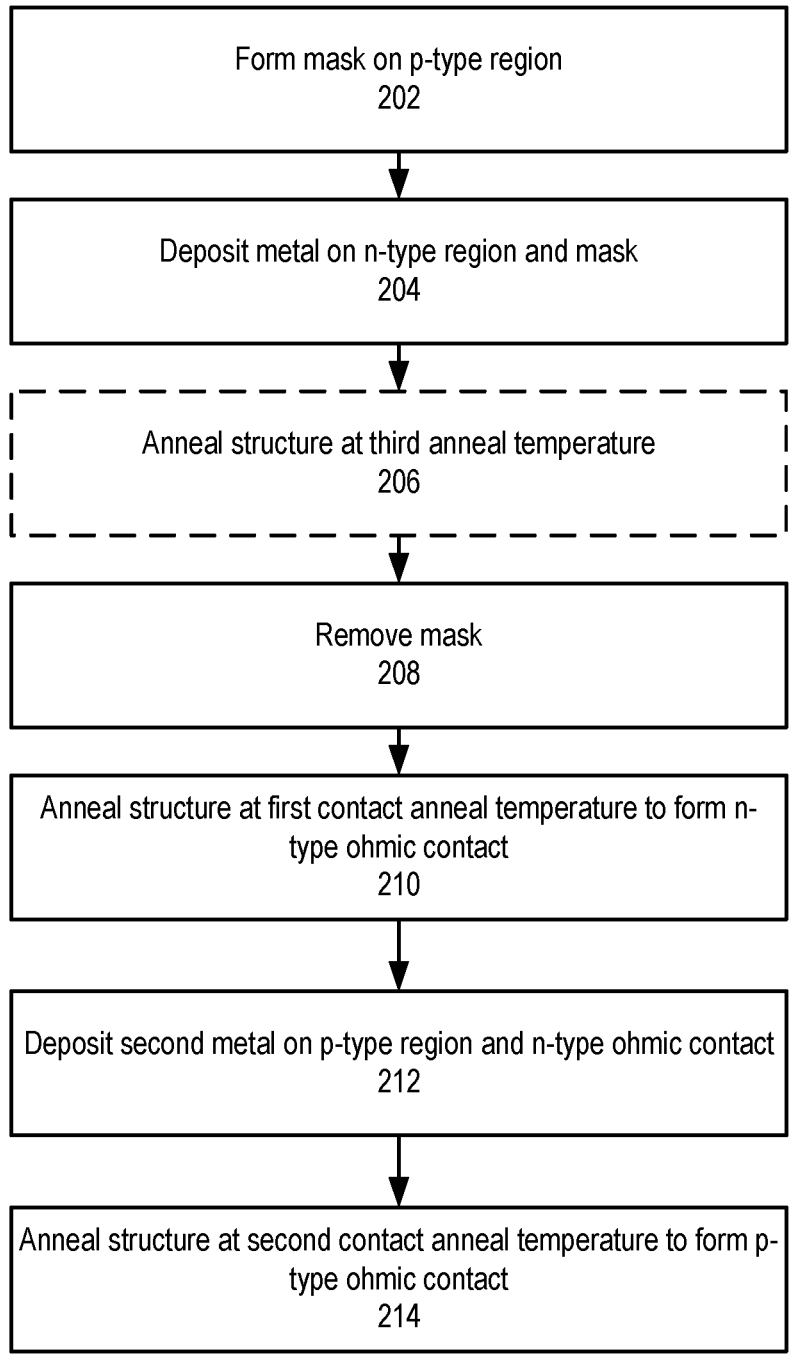
FIG. 2 is a flowchart illustrating operations for fabricating a silicon carbide semiconductor device according to some embodiments.

Operations for forming low resistance p- and n-type ohmic contacts to a silicon carbide semiconductor structure having a p-type region and an n-type region according to some embodiments are illustrated in the flowchart of FIG. 2. Referring to FIG. 2, a mask is formed on the p-type region of the silicon carbide semiconductor structure (block 202). The mask may be a photolithographic mask, such as photoresist, or a material such as silicon dioxide. A metal, such as nickel or titanium that can form an ohmic contact to n-type silicon carbide, is deposited on the mask and on the n-type region (block 204). The structure is then optionally annealed at a third anneal temperature to react the metal with the n-type silicon carbide region (block 206).

The mask is then removed (block 208), and the structure is annealed at a first contact anneal temperature that is higher than the third anneal temperature (block 210). The first contact anneal temperature is sufficient to form an n-type ohmic contact to the n-type region having a low contact resistance. A second metal is then deposited on the p-type region and on the n-type ohmic contact (block 212). The structure is then annealed at a second contact anneal temperature that is lower than the first contact anneal temperature. The second contact anneal temperature is sufficient to form a p-type ohmic contact to the p-type region having a low contact resistance. Because the p-type ohmic contact is not subjected to the high temperature anneal needed to form the n-type ohmic contact, the contact resistance of the p-type ohmic contact may be improved.

Figure 3:
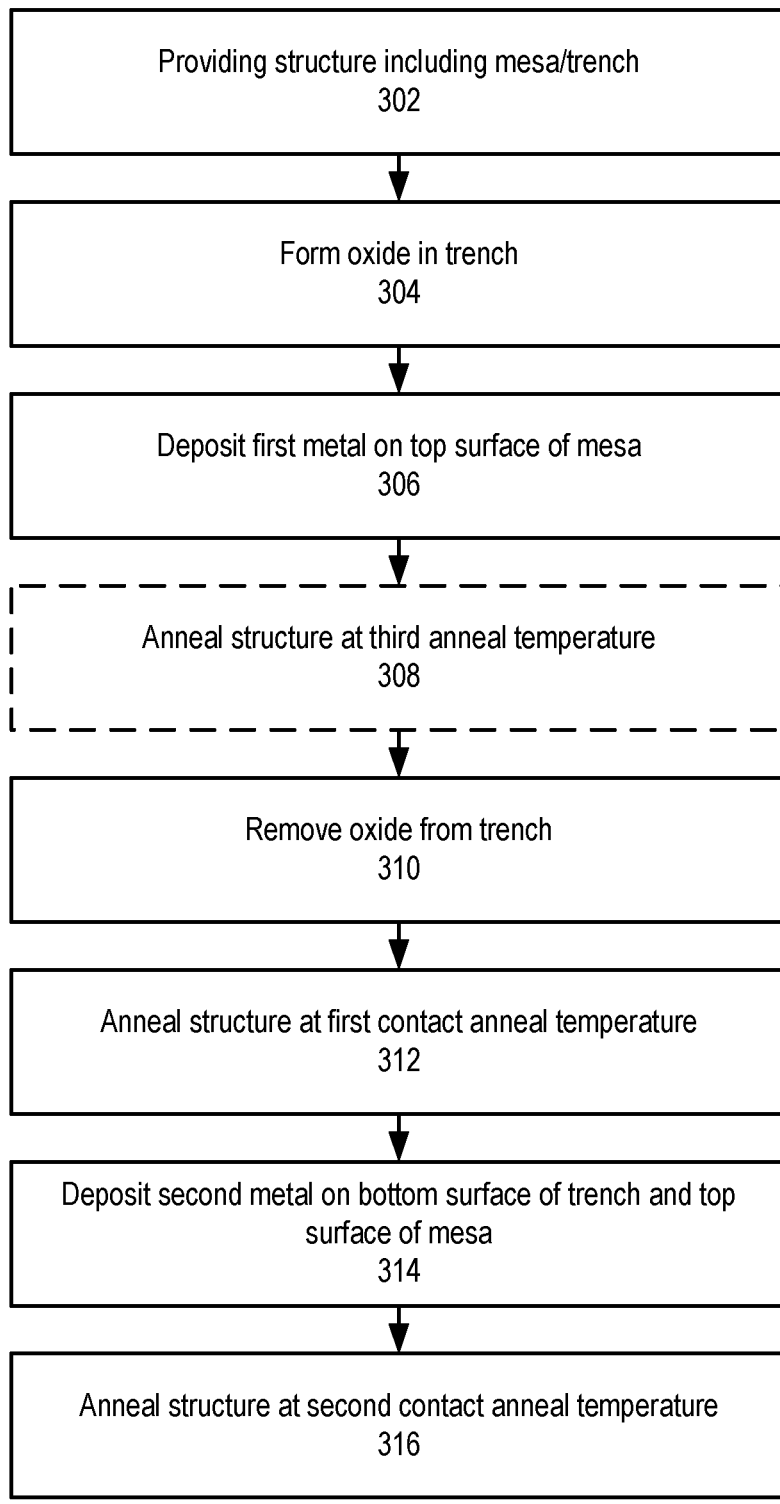
FIG. 3 is a flowchart illustrating operations for fabricating a silicon carbide semiconductor JFET device according to some embodiments.

Operations for forming low resistance p- and n-type ohmic contacts to a semiconductor structure according to further embodiments are illustrated in the flowchart of FIG. 3. In particular, the operations illustrated in FIG. 3 may be used to form self-aligned ohmic contacts with low contact resistance to a structure in which the p-type ohmic contact is at a first level in the structure (such as in a trench) and the n-type ohmic contact is at a second level of the structure that is higher than the first level (such as on a mesa).

Referring to FIGS. 1 and 3, the method includes providing a semiconductor structure 10 having a mesa 12 and a trench 14 adjacent the mesa (block 302). The semiconductor structure may include silicon carbide. A semiconductor layer at an upper surface of the mesa 12 may have a first conductivity type, and a semiconductor layer at a bottom surface of the trench may have a second conductivity type, opposite the first conductivity type.

The method includes forming a dielectric layer in the trench 14 (block 304). The dielectric layer may cover a bottom surface of the trench 14. The method further includes depositing a first metal on the top surface of the mesa 12 (block 306). The structure 10 is then optionally annealed at a third annealing temperature (block 308). The dielectric layer is then removed from the trench 14 (block 310), and the structure 10 is annealed at a first annealing temperature to form a first ohmic contact 40 to the top surface of the mesa 12 (block 312).

A second metal is then deposited on a bottom surface of the trench 14 (block 314), and the structure 10 is annealed at a second annealing temperature, that is less than the first annealing temperature, to form a second ohmic contact 36 to the bottom surface of the trench 14 (block 316). Accordingly, the first metal may be exposed to an annealing temperature that is higher than the annealing temperature to which the second metal is exposed. Thus, the first metal may form a low resistance ohmic contact to an n-type semiconductor layer, while the second metal may form a low resistance ohmic contact to a p-type semiconductor layer. Reducing the contact resistances of one or both of the n-type and p-type ohmic contacts of a structure may reduce the overall on-resistance of the device, resulting in improved device performance.

Figure 4A:
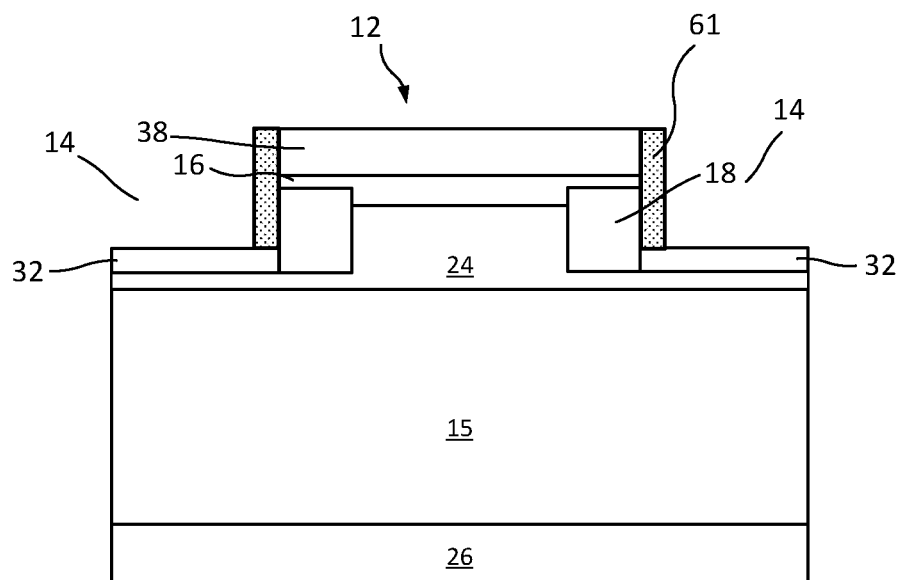
FIGS. 4A to 4H illustrate operations for fabricating a silicon carbide JFET device according to some embodiments.

Some embodiments are illustrated in more detail in FIGS. 4A to 4H. Referring to FIG. 4A, a preliminary structure is provided including a drain layer 26 on which a drift layer 15 is formed. A channel region 24 is on the drift layer 15, and a source layer 16 is on the channel region 24. A source contact layer 38 is on the source layer 16. The channel region 24, source layer 16 and source contact layer 38 are provided as part of a mesa 12 above the drift layer 15. Trenches 14 are formed in the structure 10 adjacent the mesa 12.

A gate region 18 is provided as part of the mesa 12 adjacent the channel region 24. A gate contact region 32 is provided adjacent the gate region 18. Silicon nitride spacer layers 61 are provided on sidewalls of the mesa 12.

Figure 4B:
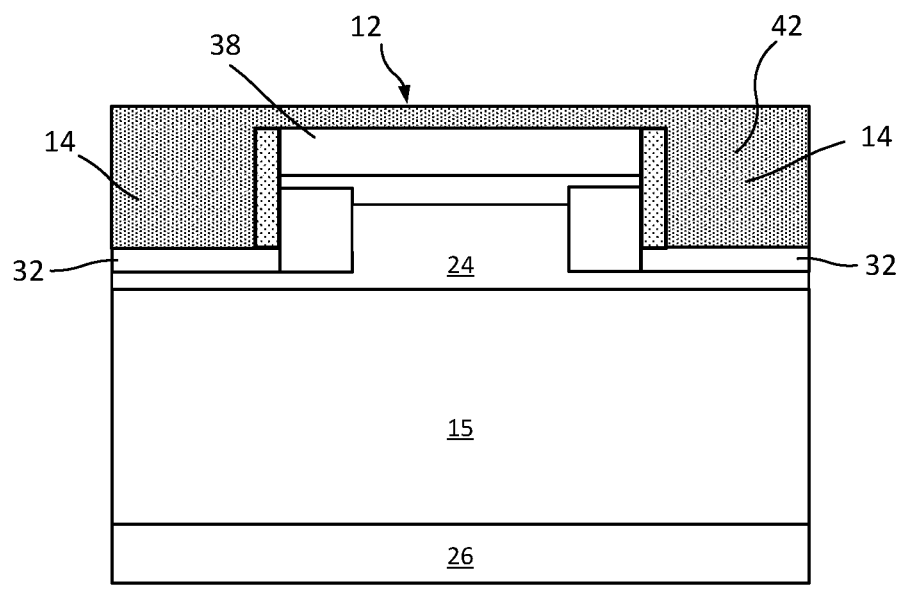

Referring to FIG. 4B, a dielectric layer 42 is blanket deposited on the top surface of the device over the mesa 12 and filling the trenches 14. The dielectric layer 42 may, for example, be an oxide layer, such as silicon oxide.

Figure 4C:
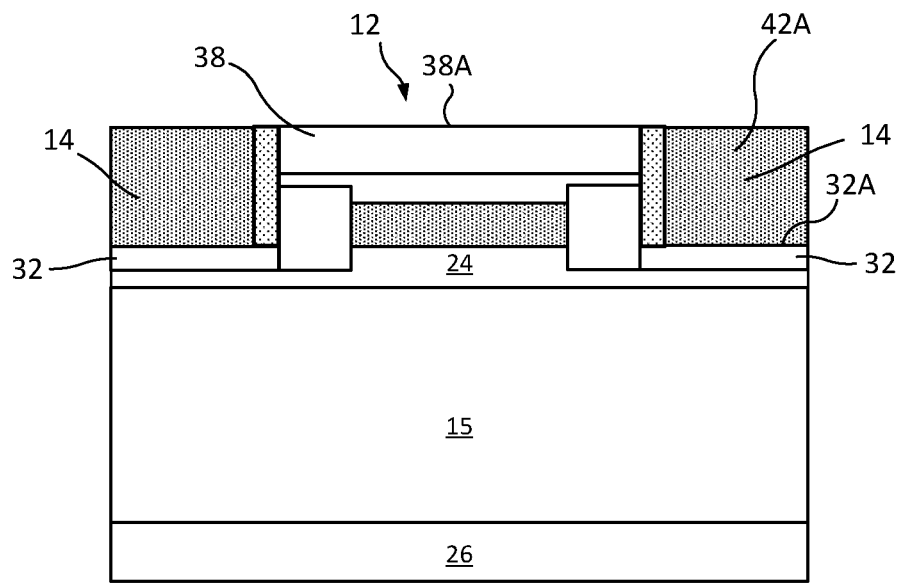

Referring to FIG. 4C, an upper portion of the dielectric layer 42 is then removed, for example, by etching or planarization to expose an upper surface of the mesa 12, leaving dielectric regions 42A within the trenches 14. In particular, an upper surface 38A of the source contact layer 38 is exposed, while upper surfaces 32A of the gate contact regions 32 (corresponding to lower surfaces of the trenches 14) are covered by the remaining dielectric regions 42A.

Figure 4D:
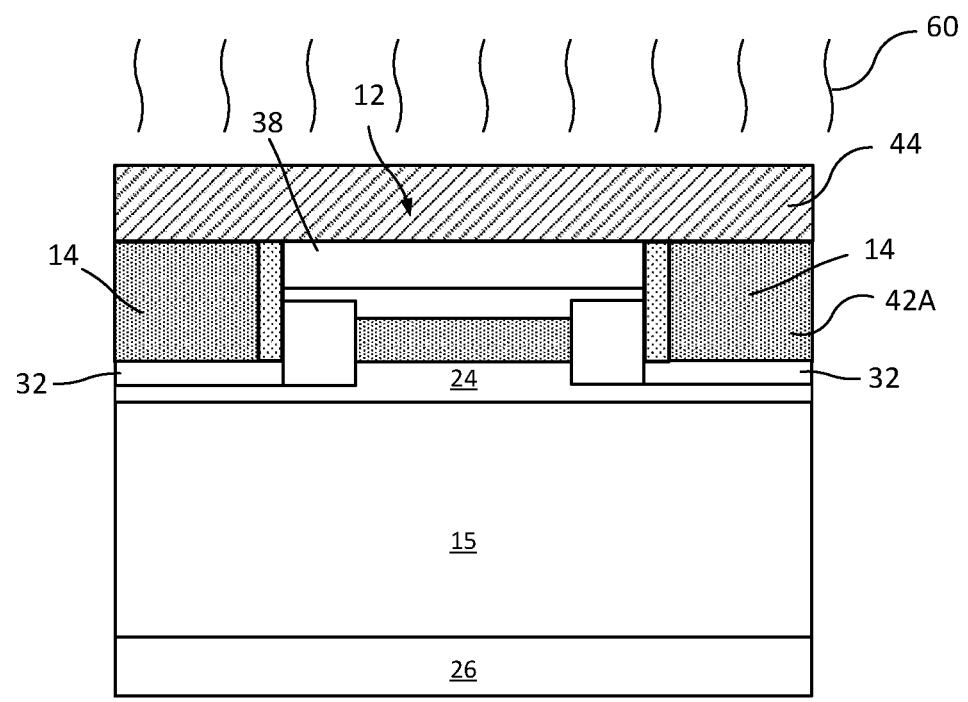

Referring to FIG. 4D, a first metal layer 44 is then blanket deposited onto the structure, for example, by a sputtering process. The first metal layer 44 may, for example, include nickel, titanium, aluminum and/or platinum. Because the upper surface of the mesa 12 was exposed by planarization, a metal contact formed thereon may be self-aligned to the mesa. That is, the metal for the contact may simply be blanket deposited onto the structure as shown in FIG. 4D, and a separate masking and etching step may not be needed to align the metal contact to the mesa 12.

When the source contact layer 38 is n-type silicon carbide, the first metal layer 44 may include nickel or titanium. When the source contact layer 38 is p-type silicon carbide, the first metal layer 44 may include nickel, aluminum or platinum.

In some embodiments, a layer of silicon may be deposited before the first metal layer 44.

The structure is then optionally annealed 60 by subjecting the structure to heat in a furnace at a third anneal temperature of about 500 to 800° C. for about 1 to 4 minutes to react the metal 44 with the material of the source contact layer 38 and form a layer of metal silicide. In some embodiments, the structure may be annealed at a temperature of greater than 700° C. for 1 to 4 minutes. In some embodiments, the structure may be annealed at a temperature of about 750° C. for 1 to 4 minutes.

Figure 4E:
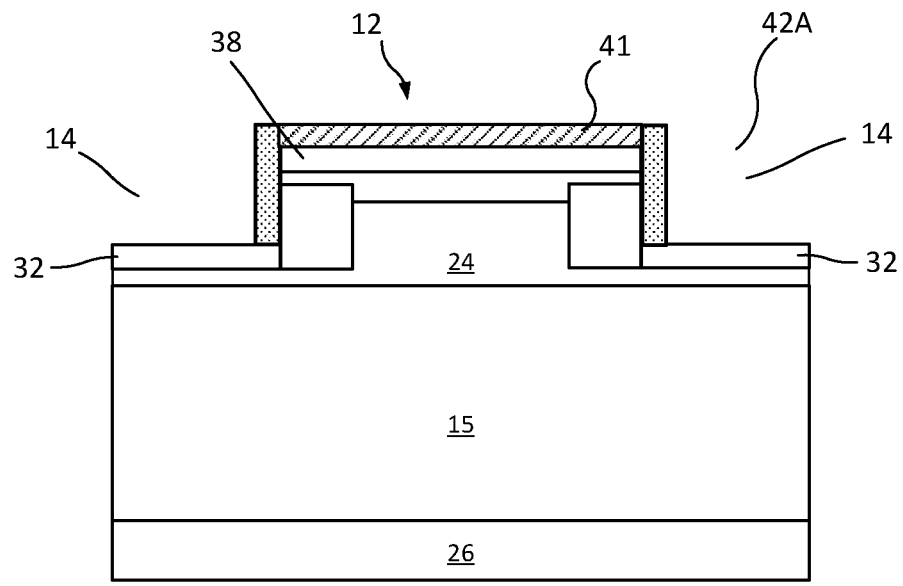

Referring to FIG. 4E, the dielectric layer 42 is then stripped, leaving a metal silicide layer 41 the source contact layer 38.

Figure 4F:
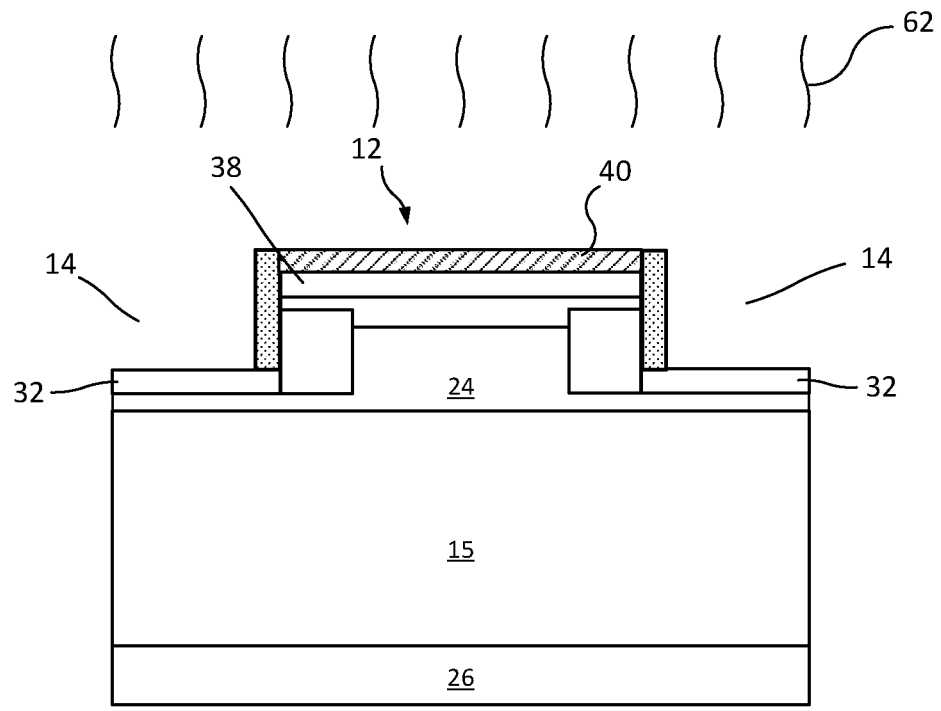

Referring to FIG. 4F, a first contact anneal 62 is performed at a first contact anneal temperature by subjecting the structure to heat in a furnace at a temperature of about 800 to 1200° C. for about 1 to 4 minutes to form an ohmic contact 40 on the source contact layer 38. In some embodiments, the source contact layer 38 comprises n-type silicon carbide, and the first contact anneal temperature is a temperature that is sufficient to form a low contact resistance ohmic contact to n-type silicon carbide. In some embodiments, the first contact anneal temperature is greater than 750 C. In some embodiments, the first contact anneal temperature is about 1000 C.

Figure 4G:
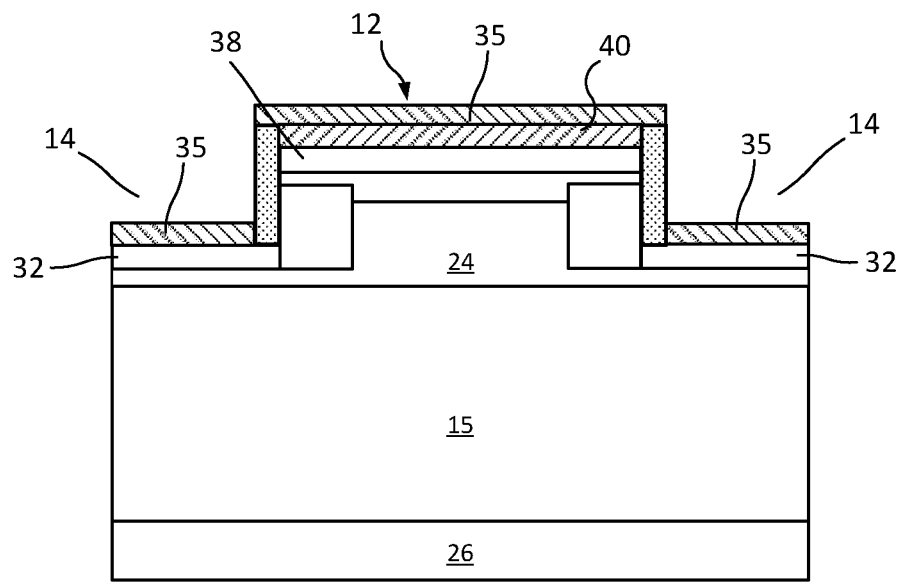

Referring to FIG. 4G, a second metal layer 35 is then deposited onto the structure, for example, by a sputtering process. The second metal layer 35 may, for example, include nickel. In some embodiments, the second metal layer 35 is the same metal as the first metal layer 44. In other embodiments, the first metal layer 44 and the second metal layer 35 may be different types of metal.

Figure 4H:
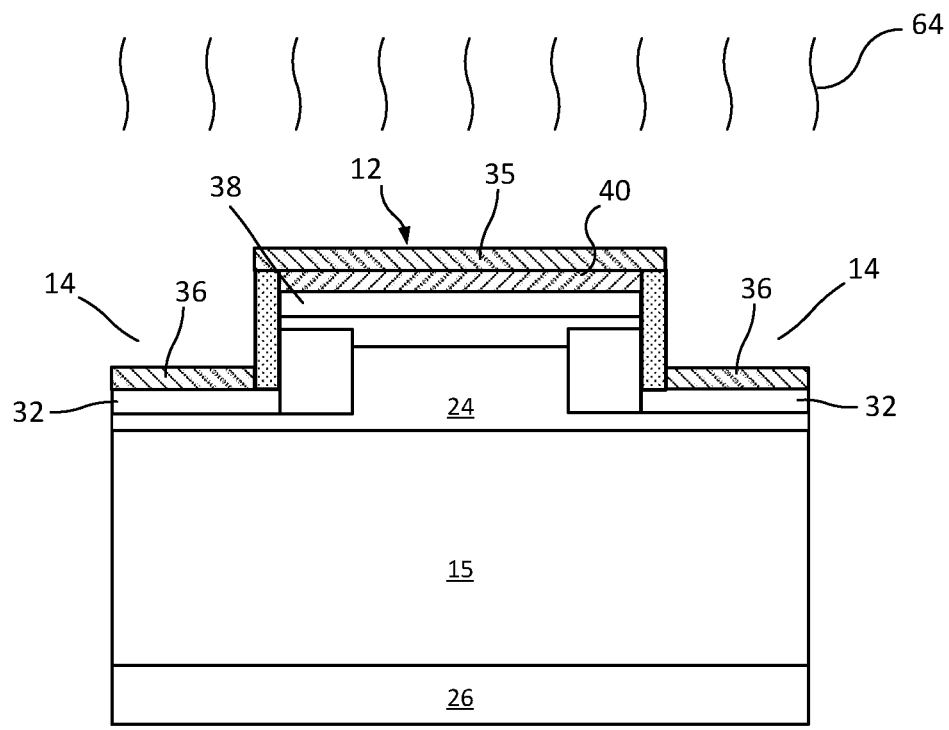

Referring to FIG. 4H, a second contact anneal 64 is performed at a second contact anneal temperature, for example by performing a rapid thermal anneal (RTA), at a temperature of about 650 to 1000° C. for about 1 to 4 minutes to form gate ohmic contacts 36 on the gate contact regions 32. In some embodiments, the gate contact layer 32 comprises p-type silicon carbide, and the second contact anneal temperature is a temperature that is sufficient to form an ohmic contact to p-type silicon carbide. The second contact anneal temperature may be lower than the first contact anneal temperature. In particular, the second contact anneal temperature may be low enough to produce ohmic contacts to the gate contact layers 32 that have a lower contact resistance than would be obtained by annealing the second metal layer 35 at the first contact anneal temperature. In some embodiments, the second anneal temperature is less than 1000 C. Because of the height of the mesa 12, the gate ohmic contacts 36 are physically separated from the source ohmic contact 40.

During the second contact anneal, the portion of the second metal layer 35 that is on the source ohmic contact 40 may alloy with the metal forming the source ohmic contact 40 and become part of the source ohmic contact 40. In some embodiments, the second metal layer 35 may remain as a distinct layer on the source ohmic contact 40.

In embodiments where the source contact layer 38 is n-type and the gate contact layers 32 are p-type, the source ohmic contact 40 and gate ohmic contacts 36 may each have contact resistances of less than 1E-3 $\Omega$-cm$^2$. In embodiments where the source contact layer 38 is n-type and the gate contact layers 32 are p-type, the source ohmic contact 40 and gate ohmic contacts 36 may each have contact resistances of less than 1E-4 $\Omega$-cm$^2$. In some embodiments, the source ohmic contact may have a contact resistance of less than 1E-4 $\Omega$-cm$^2$ and the gate ohmic contacts 36 may have a contact resistance of less than 1E-3 $\Omega$-cm$^2$.

FIG. 5 and FIGS. 6A to 6F illustrate operations for forming low resistance p- and n-type ohmic contacts to a semiconductor structure according to further embodiments. In the embodiments of FIG. 5 and FIGS. 6A to 6F, the ohmic contacts are not formed in a self-aligned manner, and thus extra photolithographic operations are needed for alignment of the contacts. However, the operations illustrated in FIG. 5 and FIGS. 6A to 6F may be used to form ohmic contacts with low contact resistance to a structure in which the n-type ohmic contact is at a first level in the structure (such as in a trench) and the p-type ohmic contact is at a second level of the structure that is higher than the first level (such as on a mesa).

Figure 5:
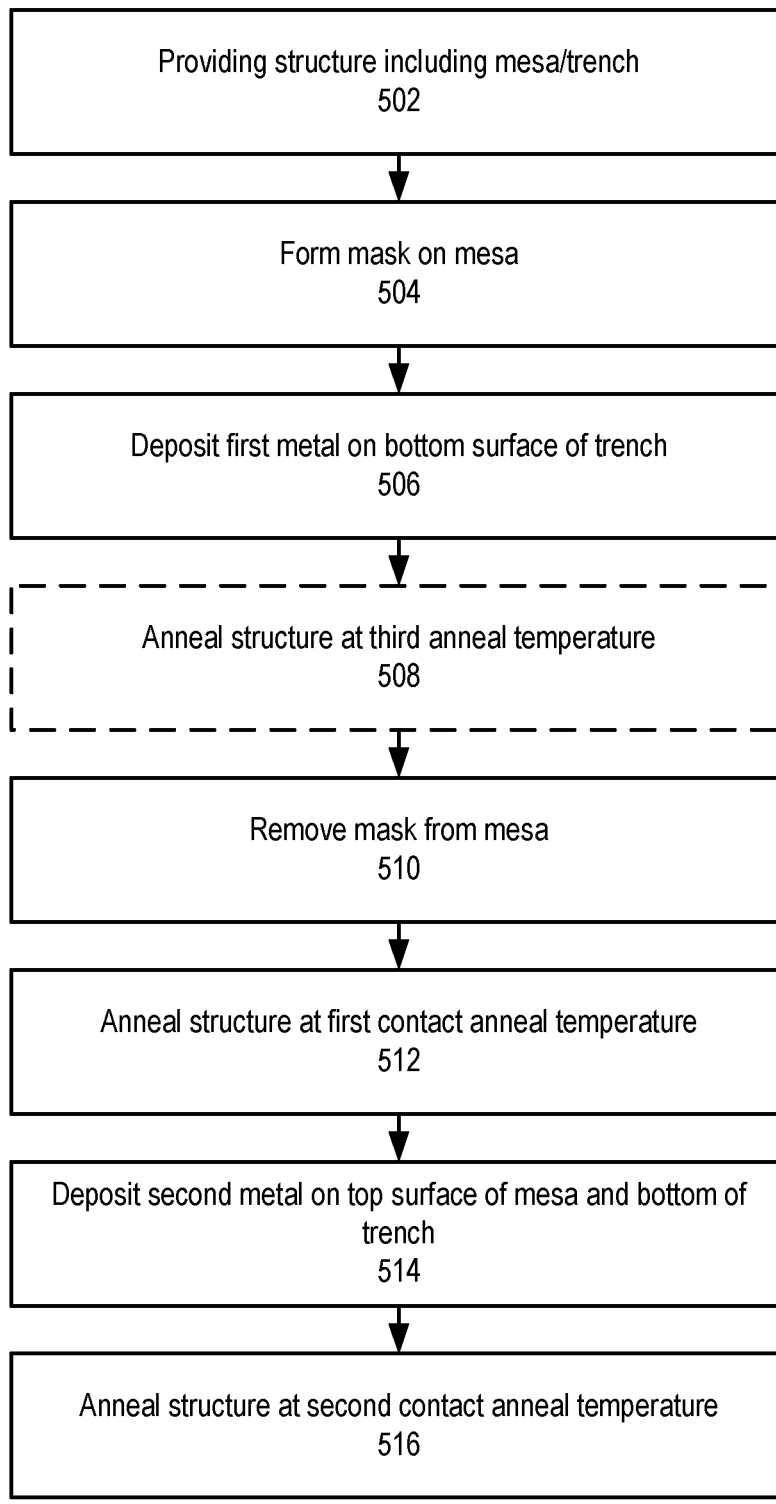
FIG. 5 is a flowchart illustrating operations for fabricating a silicon carbide JFET device according to further embodiments.

Referring to FIG. 5, the method includes providing a semiconductor structure 10 having a mesa 12 and a trench 14 adjacent the mesa (block 502). The semiconductor structure may include silicon carbide. A semiconductor layer at an upper surface of the mesa 12 may have a first conductivity type, and a semiconductor layer at a bottom surface of the trench may have a second conductivity type, opposite the first conductivity type.

The method includes forming a mask on the mesa 12 (block 504). The mask may cover a top surface of the mesa 12. The mask is patterned and etched to expose the bottom surface of the trench 14.

The method further includes depositing a first metal on the bottom surface of the trench 14 (block 506). The structure 10 is then optionally annealed at a third annealing temperature (block 508). The mask is then removed from the mesa 12 (block 510), and the structure 10 is annealed at a first annealing temperature to form a first ohmic contact 32 to the bottom surface of the trench 14 (block 512).

A second metal is then deposited on the top surface of the mesa 12 and on the first ohmic contact 32 (block 14), and the structure 10 is annealed at a second annealing temperature, that is less than the first annealing temperature, to form a second ohmic contact 40 on the top surface of the mesa 12 (block 516). Accordingly, the first metal may be exposed to an annealing temperature that is higher than the annealing temperature to which the second metal is exposed. Thus, the first metal may form a low resistance ohmic contact to an n-type semiconductor layer, while the second metal may form a low resistance ohmic contact to a p-type semiconductor layer.

Figure 6A:
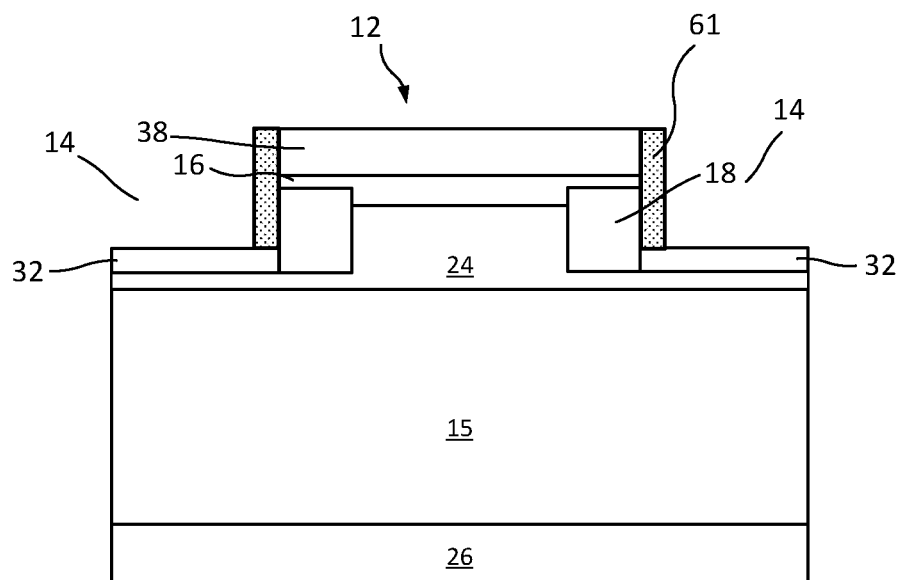
FIGS. 6A to 6F illustrate operations for fabricating a JFET device structure according to further embodiments.

The operations shown in FIG. 5 are illustrated in more detail in FIGS. 6A to 6F. Referring to FIG. 6A, a preliminary structure is provided including a drain layer 26 on which a drift layer 15 is formed. A channel region 24 is on the drift layer 15, and a source layer 16 is on the channel region 24. A source contact layer 38 is on the source layer 16. The channel region 24, source layer 16 and source contact layer 38 are provided as part of a mesa 12 above the drift layer 15. Trenches 14 are formed in the structure 10 adjacent the mesa 12.

A gate region 18 is provided as part of the mesa 12 adjacent the channel region 24. A gate contact region 32 is provided adjacent the gate region 18. Silicon nitride spacer layers 61 are provided on sidewalls of the mesa 12.

Figure 6B:
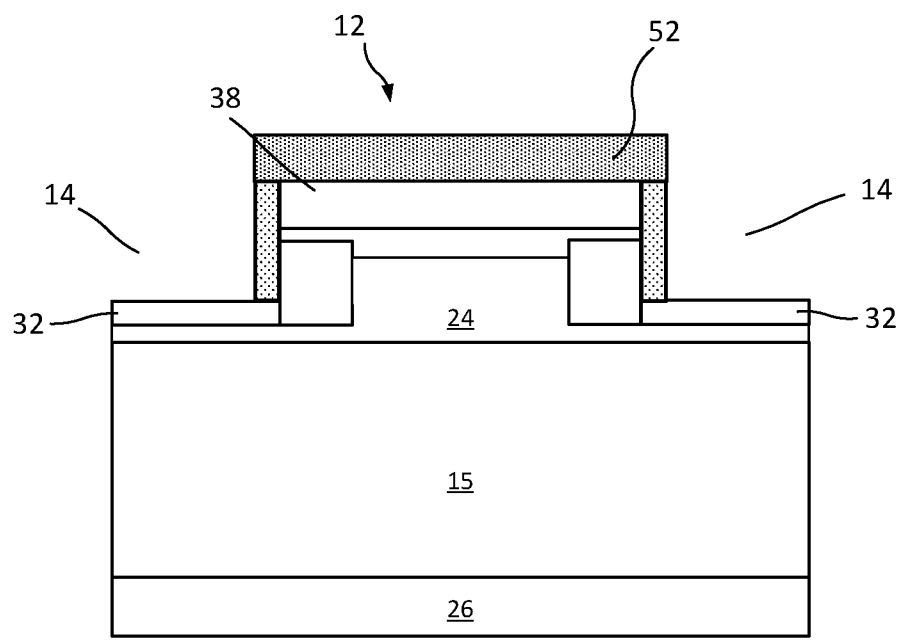

Referring to FIG. 6B, a mask 52 is formed on the top surface of the device over the mesa 12. The mask is patterned and etched using conventional photolithographic techniques to expose the trenches 14.

Figure 6C:
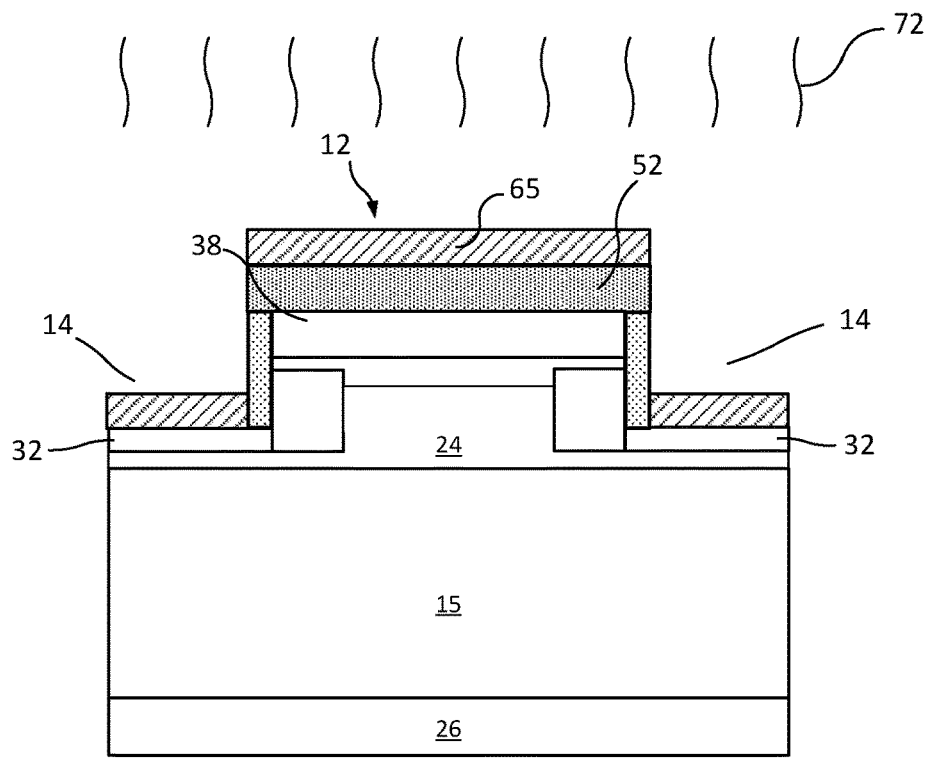

Referring to FIG. 6C, a first metal layer 65 is then blanket deposited onto the structure, for example, by a sputtering process. The first metal layer 65 may, for example, include nickel, titanium, aluminum and/or platinum. The first metal layer 65 is formed directly on the gate contact layers 32.

When the gate contact layers 32 are n-type silicon carbide, the first metal layer 65 may include nickel or titanium. When the gate contact layers 32 are p-type silicon carbide, the first metal layer 65 may include nickel, aluminum or platinum.

In some embodiments, a layer of silicon may be deposited on the first metal layer 65.

The structure is then optionally annealed 72 by subjecting the structure to heat in a furnace at a third anneal temperature of about 500 to 800° C. to react the metal 44 with the material of the gate contact layers 32 and form a layer of metal silicide 66 on the gate contact layers 32. In some embodiments, the structure may be annealed at a temperature of greater than 700° C. In some embodiments, the structure may be annealed at a temperature of about 750° C.

Figure 6D:
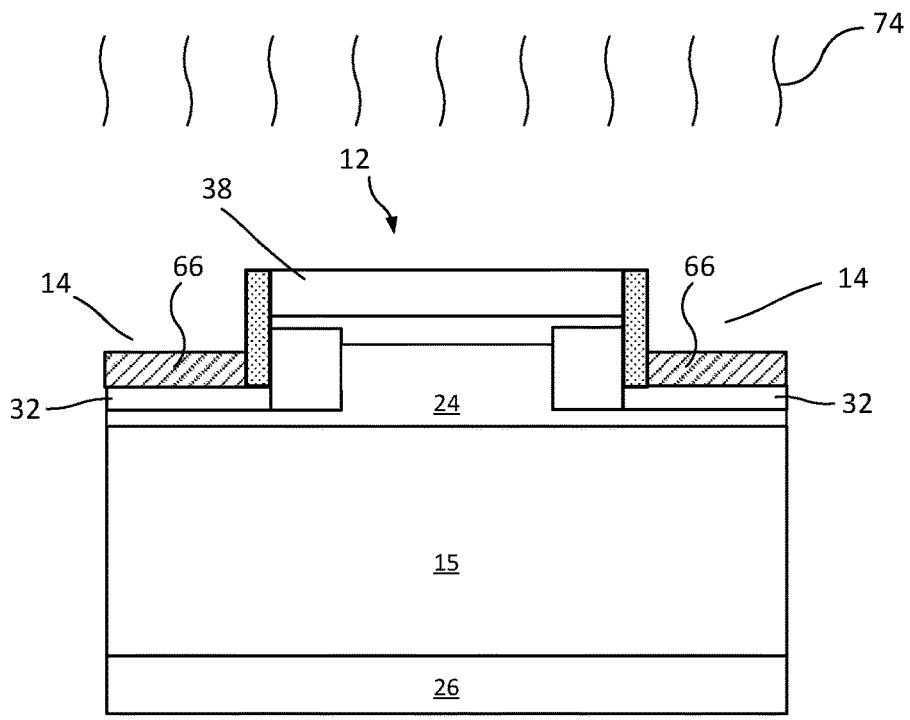

Referring to FIG. 6D, the mask 52 is then stripped, leaving a metal silicide layer on the gate contact layers 32. A first contact anneal 74 is performed at a first contact anneal temperature by subjecting the structure to heat in a furnace at a temperature of about 800 to 1200° C. to form gate ohmic contacts 66 on the gate contact layers 32. In some embodiments, the gate contact layers 32 comprise n-type silicon carbide, and the first contact anneal temperature is a temperature that is sufficient to form a low contact resistance ohmic contact to n-type silicon carbide. In some embodiments, the first contact anneal temperature is greater than 750 C. In some embodiments, the first contact anneal temperature is about 1000 C.

Figure 6E:
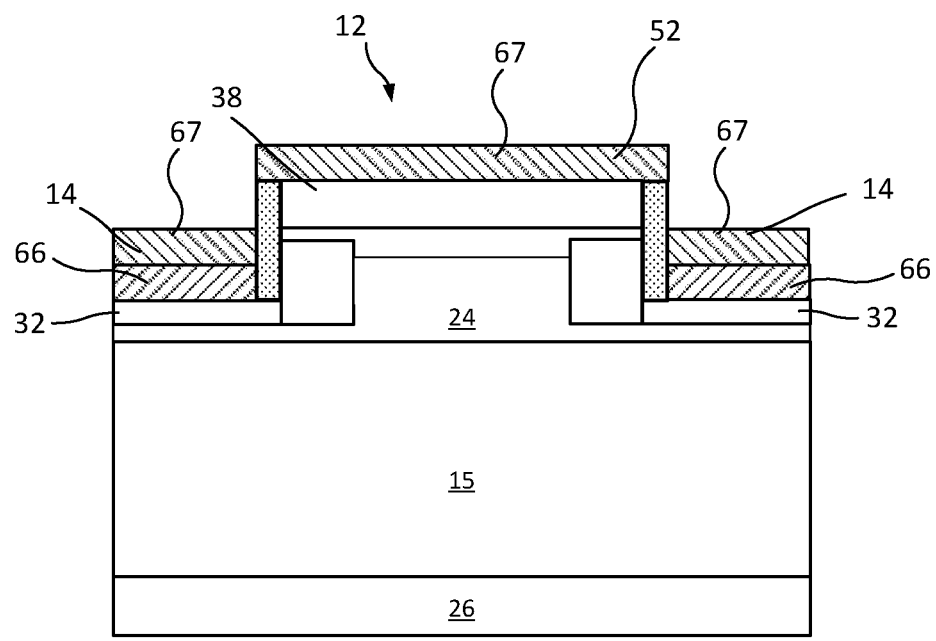

Referring to FIG. 6E, a second metal layer 67 is then deposited onto the structure, for example, by a sputtering process. The second metal layer 67 may, for example, include nickel. In some embodiments, the second metal layer 67 is the same metal as the first metal layer 65. In other embodiments, the first metal layer 65 and the second metal layer 67 may be different types of metal.

Figure 6F:
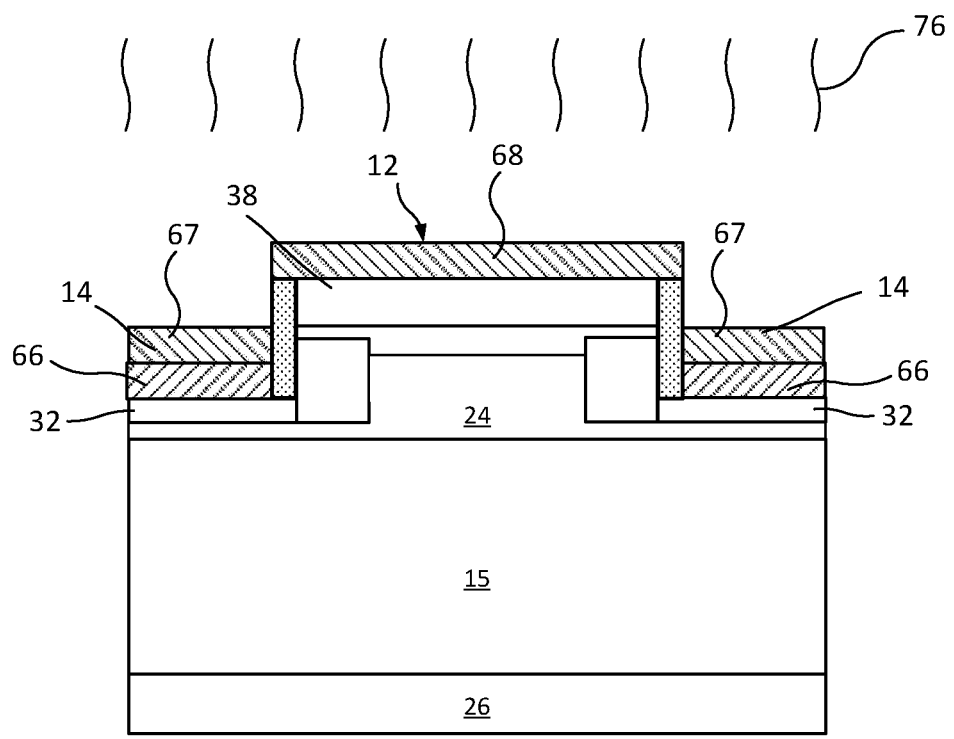

Referring to FIG. 6F, a second contact anneal 76 is performed at a second contact anneal temperature, for example by performing a rapid thermal anneal (RTA), at a temperature of about 650 to 1000° C. to form a source ohmic contact 68 on the source contact layer 38. In some embodiments, the source contact layer 38 comprises p-type silicon carbide, and the second contact anneal temperature is a temperature that is sufficient to form a low contact resistance ohmic contact to p-type silicon carbide. The second contact anneal temperature may be lower than the first contact anneal temperature. In particular, the second contact anneal temperature may be low enough to produce ohmic contacts to the source contact layer 38 that has a lower contact resistance than would be obtained by annealing the second metal layer 67 at the first contact anneal temperature. In some embodiments, the second anneal temperature is less than 1000 C. Because of the height of the mesa 12, the gate ohmic contacts 66 are physically separated from the source ohmic contact 68.

During the second contact anneal, the portion of the second metal layer 67 that is on the gate ohmic contacts 66 may alloy with the metal forming the gate ohmic contacts 66 and become part of the gate ohmic contacts 66. In some embodiments, the second metal layer 67 may remain as a distinct layer on the gate ohmic contacts 66.

In embodiments where the gate contact layers 32 are n-type and the source contact layer 38 is p-type, the gate ohmic contacts 66 and the source ohmic contact 68 may each have contact resistances of less than 1E-3 $\Omega$-cm$^2$, and in some cases less than 1E-4 $\Omega$-cm$^2$. In some embodiments, the gate ohmic contacts 66 may have a contact resistance of less than 1E-4 $\Omega$-cm$^2$ and the source ohmic contact 68 may have a contact resistance of less than 1E-3 $\Omega$-cm$^2$.

FIGS. 7A to 7G illustrate operations for fabricating a planar MOSFET device structure according to some embodiments.

Figure 7A:
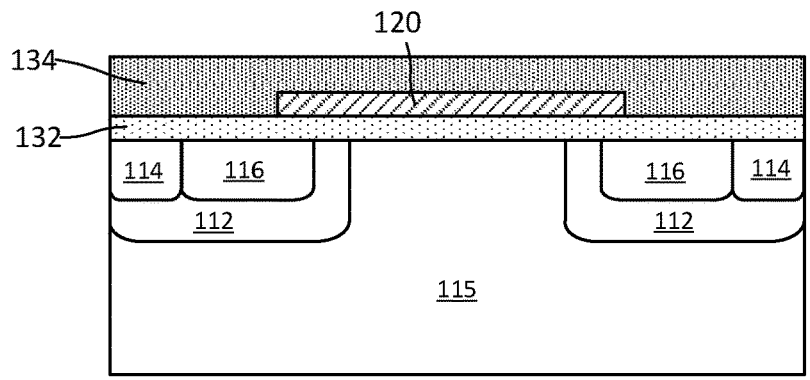
FIGS. 7A to 7G illustrate operations for fabricating a planar MOSFET device structure according to further embodiments.

Referring to FIG. 7A, a preliminary structure is provided including a silicon carbide semiconductor layer 115 in which p-well regions 112 are formed. N-type source/drain regions 116 are formed in the p-well regions 112 at the surface of the layer 115, and p-well contact regions 114 are formed in the p-well regions 112 adjacent the n-type source/drain regions 116. A gate insulating layer 132 is formed on the surface of the layer 115, and a gate contact 120 is formed on the gate insulating layer 132 in a channel region between the source/drain regions 116. An interlayer dielectric layer 134 is formed over the entire structure. The interlayer dielectric layer 134 may be SiO$_2$ or SiN.

Figure 7B:
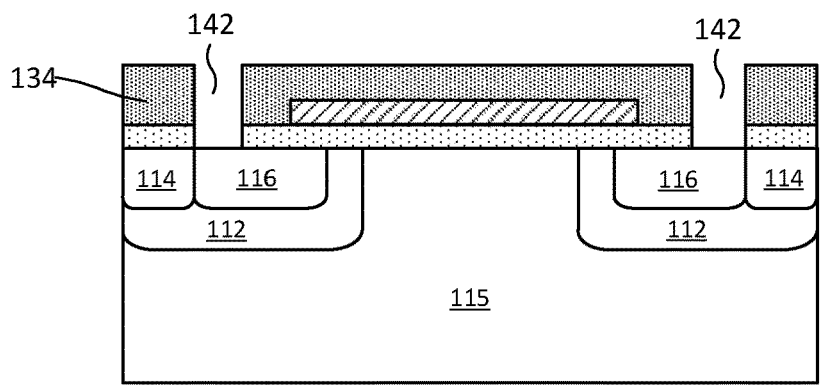

Referring to FIG. 7B, the interlayer dielectric layer 134 is selectively etched to form apertures 142 that expose portions of the source/drain regions 116 while covering the p-type contact regions 114.

Figure 7C:
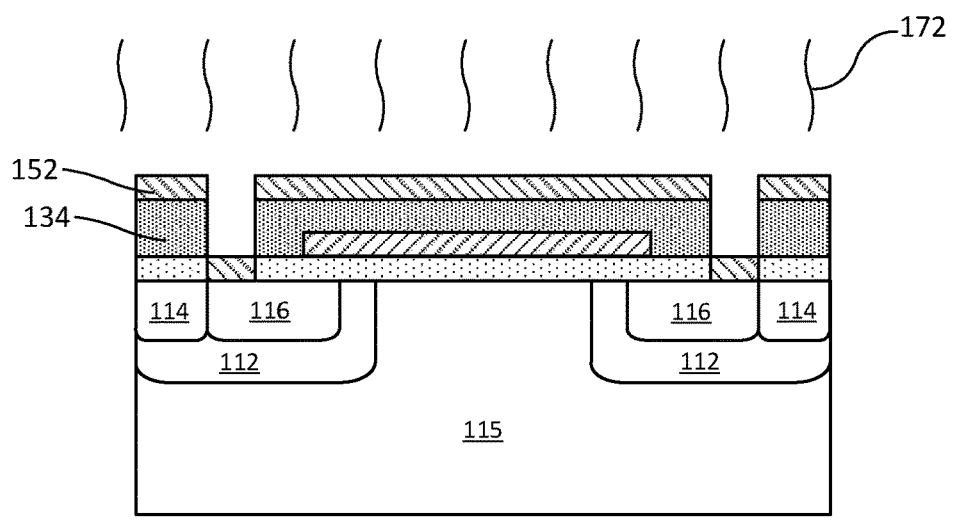

Referring to FIG. 7C, a first metal layer 152 is then blanket deposited onto the structure, for example, by a sputtering process. The first metal layer 152 may, for example, include nickel, titanium, aluminum and/or platinum. The first metal layer 152 extends and onto the exposed portions of the source/drain regions 116 in the apertures 142.

The structure is then optionally annealed 172 by subjecting the structure to heat in a furnace at a third anneal temperature of about 500 to 800° C. for about 1 to 4 minutes to react the metal 152 with the material of the source/drain layers 116 and form a layer of metal silicide on the source/drain layers 116. In some embodiments, the structure may be annealed at a temperature of greater than 700° C. In some embodiments, the structure may be annealed at a temperature of about 750° C.

Figure 7D:
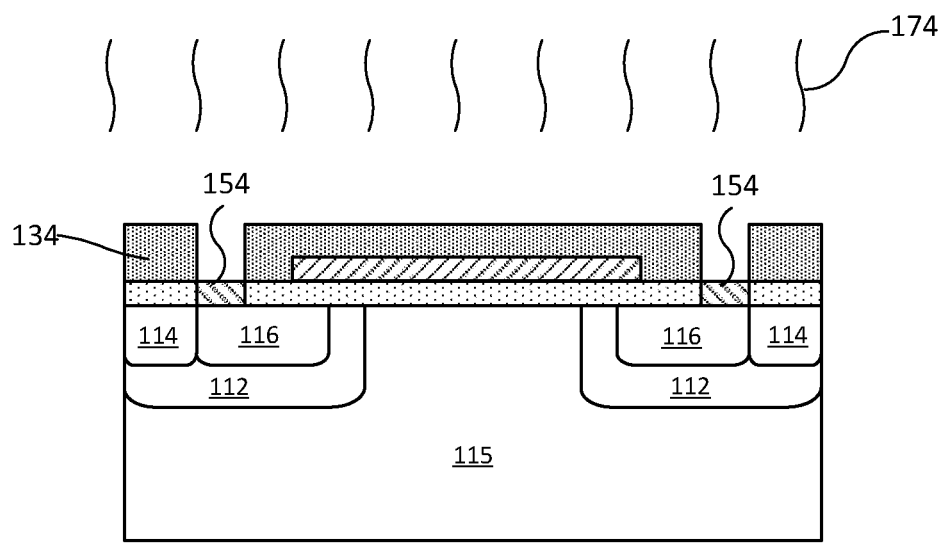

Referring to FIG. 7D, the metal 152 is then stripped from the interlayer dielectric layer 134, leaving a metal silicide layer 154 on the source/drain regions 116. A first contact anneal 174 is performed at a first contact anneal temperature by subjecting the structure to heat in a furnace at a temperature of about 800 to 1200° C. for about 1 to 4 minutes to form source/drain contacts 156 on the source/drain regions 116. In some embodiments, the source/drain regions 116 comprise n-type silicon carbide, and the first contact anneal temperature is a temperature that is sufficient to form a low contact resistance ohmic contact to n-type silicon carbide. In some embodiments, the first contact anneal temperature is greater than 750 C. In some embodiments, the first contact anneal temperature is about 1000 C.

Figure 7E:
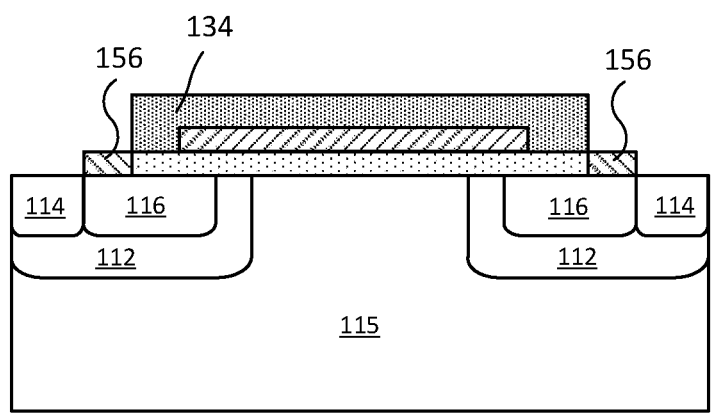

Referring to FIG. 7E, the interlayer dielectric layer 134 is then selectively etched to expose the p-well contact regions 114.

Figure 7F:
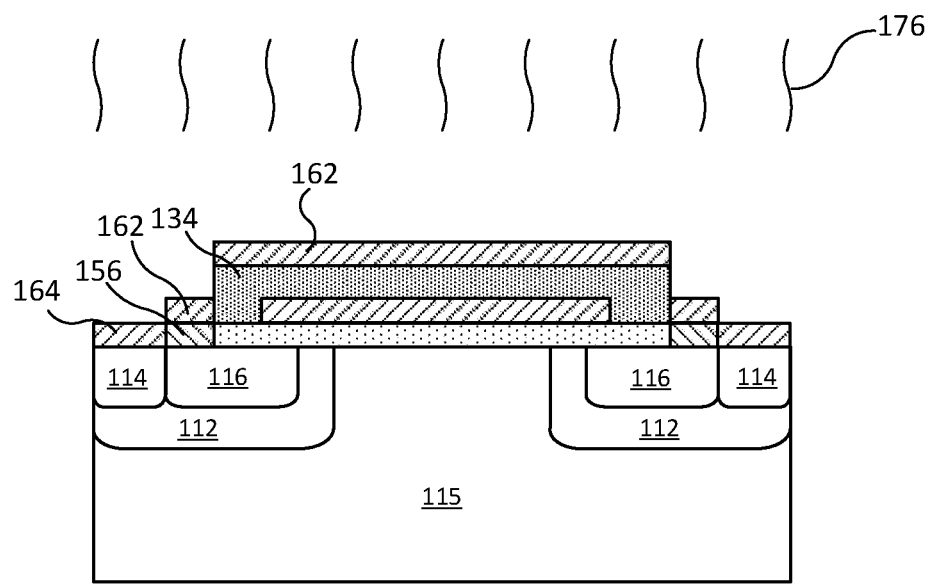

Referring to FIG. 7F, a second metal layer 162 is then deposited onto the structure, for example, by a sputtering process. The second metal layer 162 may, for example, include nickel. In some embodiments, the second metal layer 162 is the same metal as the first metal layer 152. In other embodiments, the first metal layer 152 and the second metal layer 162 may be different types of metal.

A second contact anneal 176 is then performed at a second contact anneal temperature, for example by performing a rapid thermal anneal (RTA), at a temperature of about 650 to 1000° C. for about 1 to 4 minutes to form p-type ohmic contacts 164 on the p-well contact regions 114. In some embodiments, the second contact anneal temperature is a temperature that is sufficient to form a low contact resistance ohmic contact to p-type silicon carbide. The second contact anneal temperature may be lower than the first contact anneal temperature. In particular, the second contact anneal temperature may be low enough to produce ohmic contacts to the p-well contact regions 114 that has a lower contact resistance than would be obtained by annealing the second metal layer 162 at the first contact anneal temperature. In some embodiments, the second contact anneal temperature is less than 1000 C.

During the second contact anneal, the portion of the second metal layer 162 that is on the source/drain ohmic contacts 156 may alloy with the metal forming the source/drain ohmic contacts 156 and become part of the source/drain ohmic contacts 156. In some embodiments, the second metal layer 162 may remain as a distinct layer on the source/drain ohmic contacts 156.

Figure 7G:
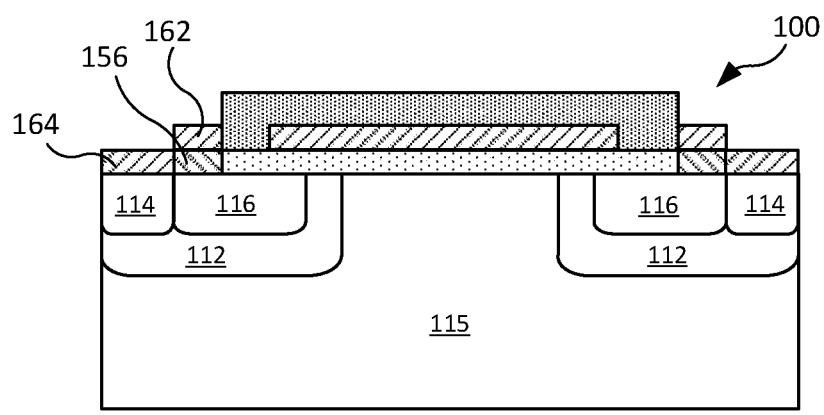

Referring to FIG. 7G, the second metal layer 162 is then stripped from the interlayer dielectric layer 134, leaving the source/drain ohmic contacts 156 and the p-well contact region ohmic contacts 164 in place.

The source/drain ohmic contacts 156 and the p-well contact region ohmic contacts 164 may each have contact resistances of less than $1E-4$ $\Omega$-$cm^2$, and in some cases less than $1E-5$ $\Omega$-$cm^2$. In some embodiments, the p-well contact region ohmic contacts 164 may have a contact resistance of less than $1E-5$ $\Omega$-$cm^2$ and the source/drain ohmic contacts 156 may have a contact resistance of less than $1E-4$ $\Omega$-$cm^2$.

Figure 8:
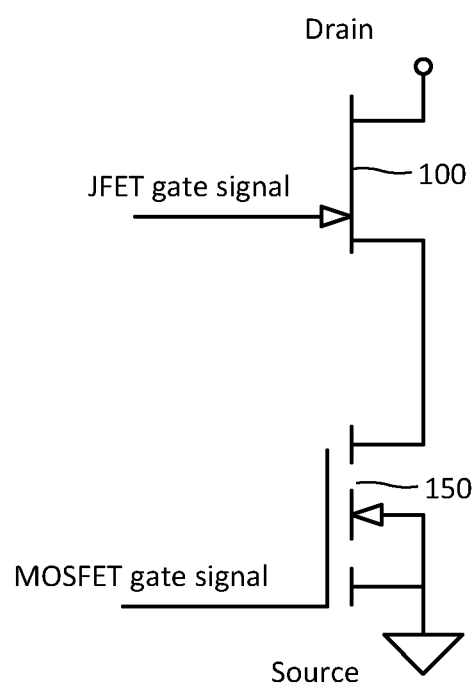
FIG. 8 illustrates an example circuit that includes a JFET device according to some embodiments.

FIG. 8 illustrates an example circuit that includes a JFET device according to some embodiments. As shown in FIG. 8, a vertical SiC JFET 100 according to some embodiments can be connected in a modified cascode topology with a Silicon MOSFET 150, where the SiC JFET gate is direct-driven, and in which it is desirable for the variation of SiC JFET threshold voltage to be very low.

A JFET device as described herein may also be advantageously used for other SiC JFET applications such as in a solid-state circuit breaker as a normally-on SiC JFET switch.

Although embodiments of the inventive concepts have been described in considerable detail with reference to certain configurations thereof, other versions are possible. The field plates and gates can also have many different shapes and can be connected to the source contact in many different ways. Accordingly, the spirit and scope of the invention should not be limited to the specific embodiments described above.

The invention claimed is:

1. A method of forming ohmic contacts on a semiconductor structure having a trench and a mesa adjacent the trench, the method comprising:
   forming a dielectric layer in the trench;
   depositing a first metal on a top surface of the mesa;
   removing the dielectric layer from the trench;
   after removing the dielectric layer from the trench, annealing the structure at a first contact anneal temperature to form a first ohmic contact on the top surface of the mesa;
   depositing a second metal on a bottom surface of the trench; and
   annealing the structure at a second contact anneal temperature, less than the first contact anneal temperature to form a second ohmic contact to the bottom surface of the trench.

2. The method of claim 1, wherein the semiconductor structure has a first conductivity type at the top surface of the mesa and a second conductivity type at the bottom surface of the trench.

3. The method of claim 2, wherein the semiconductor structure comprises silicon carbide, wherein the first conductivity type is n-type and the second conductivity type is p-type.

4. The method of claim 1, wherein the first metal and the second metal comprise a same metal.

5. The method of claim 4, wherein the first metal and the second metal comprise nickel.

6. The method of claim 1, wherein the first metal and the second metal comprise different metals.

7. The method of claim 6, wherein the first metal comprises titanium or nickel, and the second metal comprises aluminum or platinum.

8. The method of claim 1, wherein the first contact anneal temperature is greater than 750 C.

9. The method of claim 1, wherein the first contact anneal temperature is between 800 C and 1200 C.

10. The method of claim 9, wherein the second contact anneal temperature is between 650 C and 1000 C.

11. The method of claim 9, wherein annealing the structure to form the second ohmic contact comprises annealing the structure at a sufficient temperature to form a metal silicide layer on the bottom surface of the trench.

12. The method of claim 1, further comprising:
before removing the dielectric layer from the trench, annealing the structure at a third contact anneal temperature that is lower than the first contact anneal temperature.

13. The method of claim 12, wherein the third contact anneal temperature is sufficient to form a metal silicide layer at the top surface of the mesa.

14. The method of claim 12, wherein the third contact anneal temperature is between 500 C and 800 C.

15. The method of claim 12, wherein the third contact anneal temperature is greater than 700 C.

16. The method of claim 1, wherein annealing the structure to form the first ohmic contact comprises annealing the structure in a furnace, and wherein annealing the structure to form the second ohmic contact comprises performing a rapid thermal anneal of the structure.

17. The method of claim 1, wherein the structure comprises a junction field effect transistor or an insulated gate bipolar transistor structure.

18. The method of claim 1, wherein forming the dielectric layer in the trench comprises:
forming the dielectric layer on the semiconductor structure, wherein the dielectric layer covers the mesa and fills the trench; and
selectively removing a portion of the dielectric layer above the mesa to expose a top surface of the mesa.

19. The method of claim 18, wherein selectively removing the portion of the dielectric layer comprises planarizing the structure.

20. The method of claim 1, wherein the first ohmic contact and the second ohmic contact each have a contact resistance less than 1E-3 $\Omega$-cm$^2$.

21. The method of claim 1, wherein the first ohmic contact and the second ohmic contact each have a contact resistance less than 1E-4 $\Omega$-cm$^2$.

22. The method of claim 1, wherein the first ohmic contact and the second ohmic contact are separated from one another.

23. A method of forming ohmic contacts on a semiconductor structure having a trench and a mesa, the method comprising:
forming a mask on a top surface of the mesa;
depositing a first metal on a bottom surface of the trench;
removing the mask from the mesa;
annealing the structure at a first contact anneal temperature to form an ohmic contact on the bottom surface of the trench;
depositing a second metal on the top surface of the mesa; and
annealing the structure at a second contact anneal temperature that is less than the first contact anneal temperature to form a second ohmic contact to the top surface of the mesa.

24. A method of forming ohmic contacts on a semiconductor structure having a p-type region and an n-type region, the method comprising:
depositing a first metal on the n-type region;
annealing the structure at a first contact anneal temperature to form a first ohmic contact on the n-type region;
depositing a second metal on the first ohmic contact and on the p-type region; and
annealing the structure at a second contact anneal temperature, less than the first contact anneal temperature to form a second ohmic contact on the p-type region;
wherein the method further comprises:
forming a mask on the p-type region prior to depositing the first metal, wherein the first metal is deposited onto the mask;
annealing the structure at a third anneal temperature that is less than the first contact anneal temperature; and
removing the mask after annealing the structure at the third anneal temperature.

25. A method of forming ohmic contacts on a semiconductor structure having a trench and a mesa, the method comprising:
depositing a first metal on the bottom surface of the trench;
annealing the structure at a first contact anneal temperature to form a first ohmic contact on the bottom surface of the trench;
depositing a second metal on a top surface of the mesa; and
annealing the structure at a second contact anneal temperature that is less than the first contact anneal temperature to form a second ohmic contact to the top surface of the mesa;
wherein the method further comprises:
forming a mask on the top surface of the mesa prior to depositing the first metal on the bottom surface of the trench; and
removing the mask from the top surface of the mesa after depositing the first metal on the bottom surface of the trench.

26. The method of claim 25, wherein the top surface of the mesa comprises a p-type material and the bottom surface of the trench comprises an n-type material.

27. The method of claim 25, wherein the first contact anneal temperature is between 800 C and 1200 C.

28. The method of claim 25, wherein the second contact anneal temperature is between 650 C and 1000 C.

\* \* \* \* \*